US005109415A

United States Patent [19]

Ishida

[11] Patent Number: 5,109,415

[45] Date of Patent: Apr. 28, 1992

[54] AUDIO SIGNAL PROCESSING SYSTEM PERFORMING BALANCE CONTROL IN BOTH AMPLITUDE AND PHASE OF AUDIO SIGNAL

[75] Inventor: Ryuji Ishida, Tokyo, Japan

[73] Assignee: NEC Corporation, Tokyo, Japan

[21] Appl. No.: 400,622

[22] Filed: Aug. 30, 1989

[30] Foreign Application Priority Data

Aug. 30, 1988 [JP] Japan .................. 63-216162

[51] Int. Cl.5 .................. H04S 1/00; H03G 3/00

[52] U.S. Cl. .................. 381/1; 381/109

[58] Field of Search .................. 381/1, 17, 63, 109, 381/24, 97

[56] References Cited

U.S. PATENT DOCUMENTS 4,581,759 4/1986 Takahashi .................. 381/63
4,769,843 9/1988 Imai et al. .................. 381/86
4,792,974 12/1988 Chace .................. 381/1

FOREIGN PATENT DOCUMENTS 0219300 9/1986 Japan .................. 381/86
0291300 12/1987 Japan .................. 381/86

*Primary Examiner*—Forester W. Isen
*Attorney, Agent, or Firm*—Sughrue, Mion, Zinn, Macpeak & Seas

[57] ABSTRACT

Disclosed therein is an audio signal processing system for performing a balance control, which includes an attenuator for performing an amplitude attenuation operation on the designated channel signal and a delay circuit coupled in series to the attenuator for performing a phase delay operation on the designated channel signal. There is further provided a balance control unit which produces attenuation data and delay data in response to balance control information, the attenuation data and delay data being supplied to the attenuator and the delay circuit, respectively. Not only the amplitude but also phase of the designated channel signal are thereby attenuated and delayed.

6 Claims, 5 Drawing Sheets

AUDIO SIGNAL PROCESSING SYSTEM PERFORMING BALANCE CONTROL IN BOTH AMPLITUDE AND PHASE OF AUDIO SIGNAL

BACKGROUND OF THE INVENTION

The present invention relates to an audio signal processing system and, more particularly, to such a system having a balance control function in which a suitable listening position is electrically realized.

One of important control factors in a stereophonic audio system is a balance control of acoustic pressures and sound phase to realize a suitable listening position by the compensation of sound position images. In a car audio system in particular, not only the installed positions of speakers but also the listening position of a listener such as a driver are restricted, so that the distances from the listener to the respective speakers are in general different from each other. Therefore, it is required to perform a balance control such that the respective speakers exist imaginarily at the same distance from the listener.

However, the balance control system according to prior art merely controls the acoustic pressures at the listener's position. For example, when a balance control knob or key is operated in a left (or right) channel direction, only the acoustic pressure from a right (or left) channel speaker is controlled to become small. Thus, the conventional balance control system merely performs a control such that the left and right channel acoustic pressures actually received by the listener are made equal to each other.

In order to realize a balance control such that the respective speakers are located imaginarily at the same distance from the listener, not only the respective acoustic pressures reaching the listener but also the times for required by the sounds from the respective speakers to reach the listener, i.e. the phases of the respective sounds, have to be made coincident with each other.

SUMMARY OF THE INVENTION

Therefore, an object of the present invention is to provide an audio signal processing system performing a balance control such that respective speakers exist at the same distance from a listener irrespective of the respective speakers being installed at the different distance from the listener.

Another object of the present invention is to provide a balance control system in an audio processing apparatus which controls both a sound pressure and a sound phase of an output from a designated speaker in response to balance control information.

A system according to the present invention comprises an attenuation circuit and a delay circuit disposed in series in a signal path between an audio signal source and a speaker, a control information generator responding to balance control information for generating both amplitude control information and phase control information from the balance control information, and means for supplying the amplitude control information and phase control information to the attenuation circuit and the delay circuit, respectively, the attenuation circuit performing an amplitude attenuation operation on an audio signal from the signal source and the delay circuit performing an a phase delay operation on the audio signal.

It should be noted that the present invention is based upon the fact that when the distance between a listener and a predetermined speaker is known as a standard distance, the sound pressure to be controlled for the remaining speaker(s) is determined from the sound phase to be controlled for the same and vice versa.

More specifically, assuming that the distance between a listener and a speaker is R [m] and the sound pressure from the speaker is A [dB], the sound pressure reaching the listener, D [dB], is represented by the following equation (1).

$$D=A-20\log R-K, \quad (1)$$

wherein K is a constant and is dependent on the acoustic environments.

A time required by a sound propagating through space by the distance R, i.e. a sound propagation time T [sec], is represented as follows by using the sonic speed S [m/sec]:

$$T=R/S. \quad (2)$$

Considering the case of an audio system having two speakers, therefore, assuming that the distances between the listener and the first and second speakers are $R_1$ [m] and $R_2$ [m], respectively, the difference the sound pressures reaching the listener from the respective speakers, i.e. the sound pressure difference B [dB], and the difference between the times required by the sounds reaching the listener from the respective speakers, i.e. the sound propagation time difference C [sec], are represented as follows:

$$B=20\log R_1-20\log R_2, \quad (3)$$

$$C=(R_1-R_2)/S. \quad (4)$$

Since the equation (3) is modified to the equation (5):

$$R_2/R_1=10^{\frac{-B}{20}}, \quad (5)$$

the equation (6) is obtained:

$$C=\frac{R_1}{S}\left(1-10^{\frac{-B}{20}}\right). \quad (6)$$

Thus, in the case where the distance $R_1$ is preliminarily known, when the sound pressure difference B is given as the balance control information, the sound propagation time difference (i.e. phase difference) C is obtained therefrom and vice versa. For example, when the balance control knob or key is operated by listener such that the sound pressures reaching the listener become equal to each other, i.e. when the sound pressure difference B is inputted via the balance control knob or key, the phase difference data C is obtained accordingly from the equation (6). These data B and C are supplied to the attenuation circuit and delay circuit, respectively, so that the amplitude attenuation operation and the signal phase delay operation are performed, respectively. As a result, both the sound pressures and the sound phases reaching the listener from the respective speakers are made coincident with each other. It is thus realized such a balance control that the respective speakers are disposed imaginarily at the same distance from the listener.

SUMMARY OF THE INVENTION

The above and other objects, advantages and features of the present invention will be more apparent from the following description taken in conjunction with the accompanying drawings, in which FIG. 1 is a block diagram representative of an embodiment of the present invention;

DETAILED DESCRIPTION OF THE EMBODIMENTS

Figure 1:
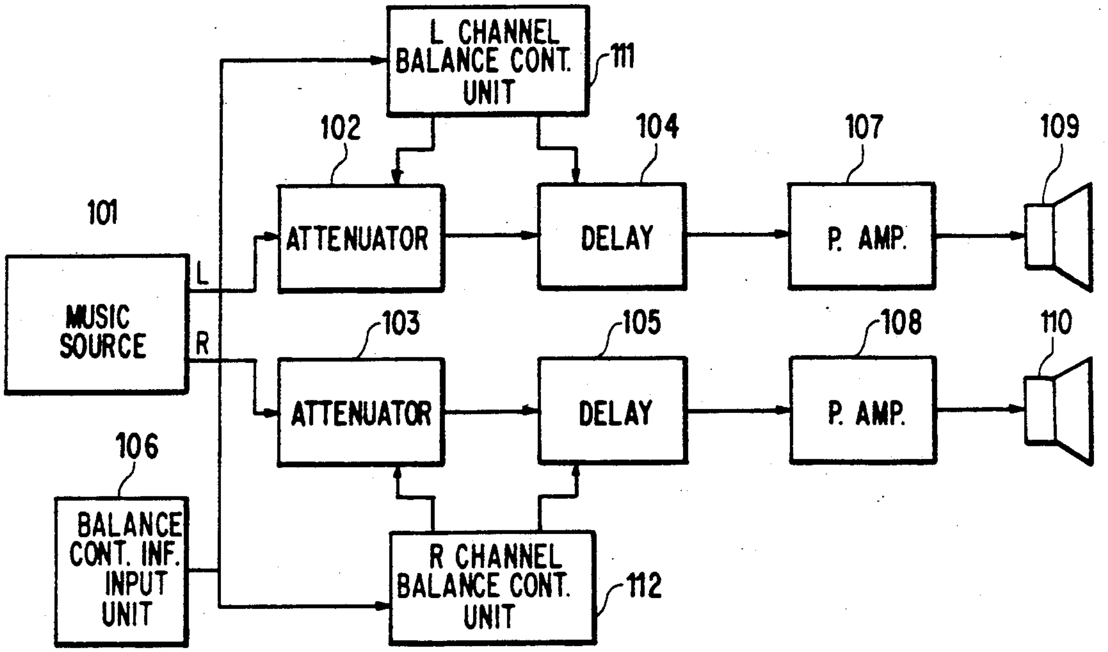

Referring now to FIG. 1, there is shown an audio signal processing system of two-channel and two-speaker type according to an embodiment of the present invention. An audio signal source such as a compact disk player (CD), an AM/FM radio tuner, etc. is denoted as a music source 101 which produces a left channel signal (L) and a right channel signal (R). The left channel signal (L) is outputted from a left channel speaker 109 as a left channel sound through an attenuator 102, a delay circuit 104 and a power amplifier 107. The right channel signal (R) is outputted from a right channel speaker 110 as a right channel sound through an attenuator 103, a delay circuit 105 and a power amplifier 108.

Figure 2:
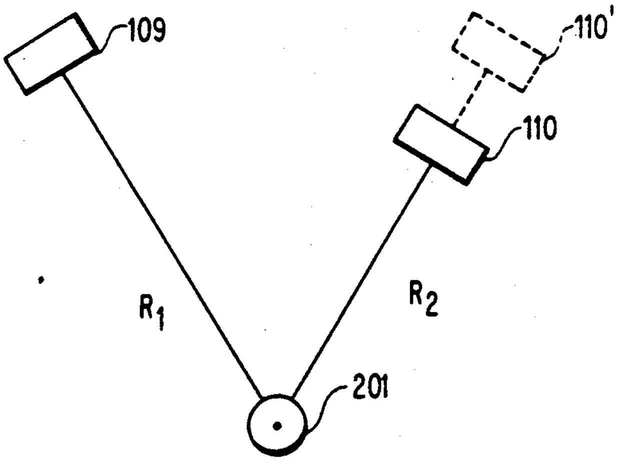
FIG. 2 is a location diagram of respective speakers with respect to a listener.

Referring to FIG. 2, the left channel speaker 109 is located physically at a distance of $R_1$ [m] from a listener 201 and the right channel speaker 110 is located physically at a distance of $R_2$ [m] from the listener 201. Therefore, it is required to perform a balance control such that the right channel speaker 110 is imaginarily moved and positioned at a distance of $R_1$ from the listener 201, as denoted by a dotted line 110' in FIG. 2.

For this purpose, the system shown in FIG. 1 further includes a balance control information input unit 106, a left channel balance control unit 111 and a right channel balance control unit 112. These control units 111 and 112 responds to the balance control information from the input unit 106 and supply attenuation information and delay information to the corresponding attenuators 102 and 103 and the delay circuits 104 and 105, respectively, In the present system, for the purpose of preventing the deterioration of the audio signal, the amplitude attenuation operation and the phase delay operation on the left and right channel signals are performed in a digital signal processing form. The left and right channel signals L and R from the source 101 are therefore converted into digital data, and the attenuators 102 and 103 and the delay circuits 104 and 105 are constituted by a digital circuit, which are described later in detail. The data from the delay circuit 104 and 105 are converted in an analog signal and then supplied to the power amplifiers 107 and 109, respectively. Each of the balance control units 111 and 112 includes a memory for storing attenuation information and delay information corresponding thereto obtained from the above equations (5) and (6), which are also described later in detail.

Figure 3A:
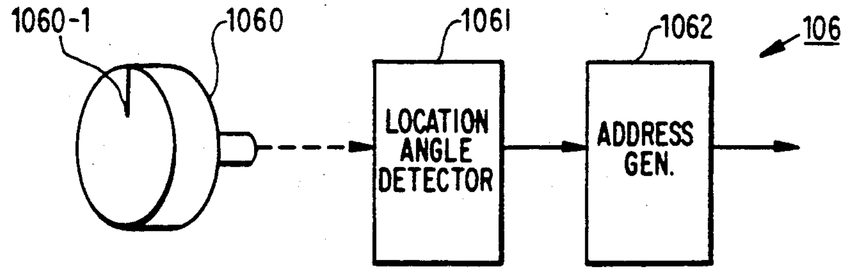
FIGS. 3A and 3B are block diagram representative of first and second examples of a balance control information input unit shown in FIG. 1.

Referring to FIG. 3A, the balance control information input unit 106 includes a balance control knob 1060, a detector 1061 for detecting the location angle of the knob 1060 and an address generator 1062 for generating a memory access address in response to the output of the detector 1061. A mark 1060-1 on the knob 1060 denotes the balance condition between the left and right channels. When the mark 1060-1 exists in the center position, the sound pressures and phases from the speakers 109 and 110 are equal to each other. In this condition, the address generator 1062 generates an address of "00H". Here, "H" denotes a hexadecimal notation. When the knob 1061 is rotated in a left direction, the address outputted from the generator 1062 is changed in the manner of "00H"→"01H"→"02H"→ . . . in accordance with the rotation angle of the knob 1061. This change results in the attenuation of the sound pressure and the delay of the phase from the output of the left channel speaker 110. On the other hand, the rotation in a right direction of the knob 1061 changes the address from the generator 1062 in the manner of "00H"→"FFH"→"FEH"→ . . . , so that the sound pressure and phase from the left channel speaker 109 are attenuated and delayed, respectively.

Figure 3B:
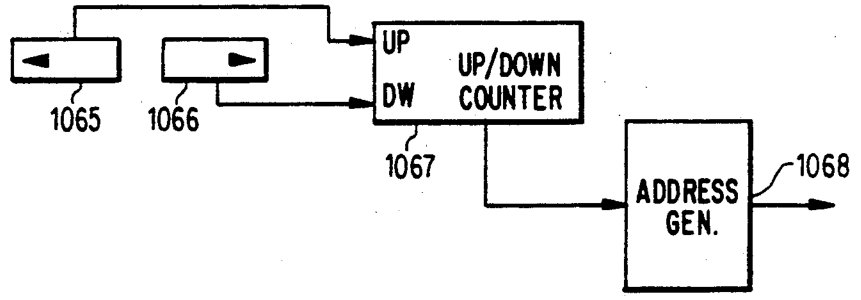

FIG. 3B shows another example of the input unit 106 in which a left channel key 1065, a right channel key 1066, an up/down counter 1067 and an address generator 1068 are employed. The count value of the counter 1065 is incremented by one every time the key 1065 is operated, so that the address from the generator 1068 is changed in the manner of "00H"→"01H"→"02H"→ . . . . In case of operation of the key 1066, the count value of the counter 1067 is decremented, so that the address from the generator 1068 is changed in the manner of "00H"→"FFH"→"FEH"→ . . . . the address from the generator 1062 or 1068 is supplied in common to the balance control units 111 and 112.

Figure 4:
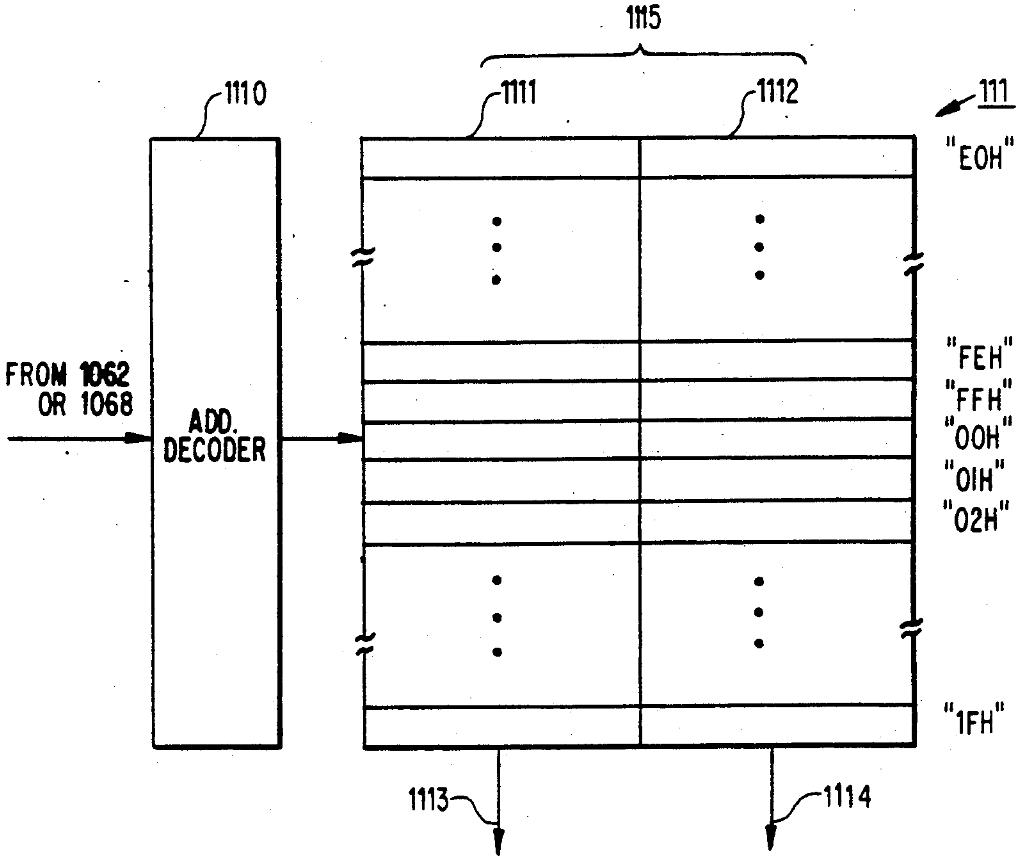
FIG. 4 is a block diagram representative of a left channel balance control unit shown in FIG. 1.

Referring to FIG. 4, the left channel balance control unit 111 includes an address decoder 1110 for decoding the address from the input unit 106 and a memory 115 having first and second memory banks 1111 and 1112. The first memory bank 1111 stores attenuation data and the second memory bank 1112 stores delay data. One memory location of the bank 1111 and that of the bank 1112 are accessed simultaneously by the output from the decoder 1110, and the data stored therein are read out onto buses 1113 and 1114, respectively.

Figure 5:
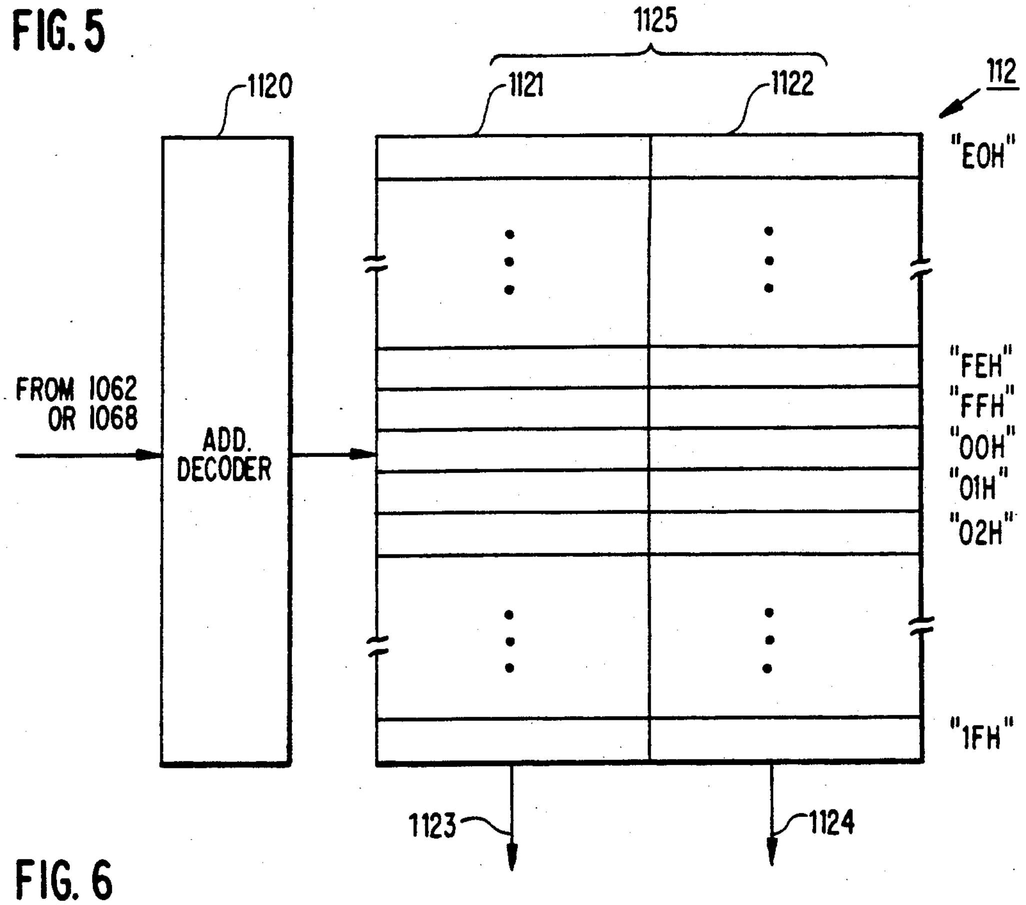
FIG. 5 is a block diagram representative of a right channel balance control unit shown in FIG. 1.

Similarly, the right channel balance control unit 112 includes, as shown in FIG. 5, an address decoder 1120 and a memory 1125 having first and second memory banks 1121 and 1122. The first memory bank 1121 stores attenuation data and the second memory bank 1122 stores delay data. On memory location of the bank 1121 and that of the bank 1122 are accessed simultaneously by the output of the decoder 1120 and data stored therein are read out onto buses 1123 and 1124, respectively.

When the address from the unit 106 is "00H", the sound pressures and phases from the speakers 109 and 110 are equal to each other, and therefore the memory locations of the memories 1115 and 1125 designated by the address "00H" store data indicating no amplitude attenuation and no signal phase delay. The rotation in the left direction of the knob 1060 or the operation of the left channel key 1065 changes the address of the generator 1062 or 1068 in the matter of "00H"→"01H"→""02H"→ . . . , attenuates the sound pressure of the right channel output and delays the phase thereof. Accordingly, the address locations of the memory 1115 designated by the addresses "01H" to "1FH" store the same data as the location designated by the address "00H", whereas the address locations of the memory 1125 designated by the addresses "01H" to "1FH" store data for attenuating the left channel sound pressure and for delaying the phase thereof in predetermined steps. On the other hand, since the change in address, "000H"→"FFH"→"FEH"→ . . . , from the generator 1062 or 1068 is used for controlling the left channel, the address locations of the memory 1125 designated by the addresses "FFH" to "EOH" store the same data as the location of the address "00H", whereas the locations of the memory 1115 designated by the addresses "FFH" to "E0H" store data for attenuating the left channel output and for delaying the phase thereof. Thus, both of the attenuation and delay data are obtained from the same balance control information.

Figure 6:
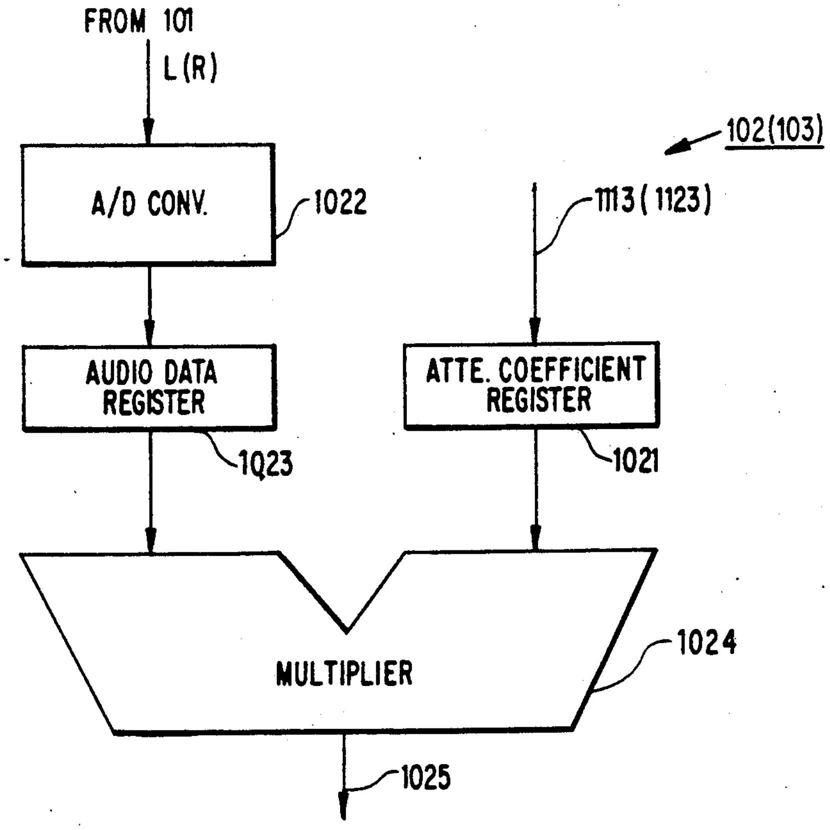
FIG. 6 is a block diagram representative of each attenuator shown in FIG. 1.

The attenuation data from the memories 1115 and 1125 are supplied via the buses 1113 and 1123 to the attenuators 102 and 103, respectively. Each of the attenuators 102 and 103 has the same circuit construction and includes, as shown in FIG. 6, a register 1021, an A/D converter 102, a register 1023 and a multiplier 1024. The attenuation data from the memory 1115 (1125) is temporarily stored via the bus 1113 (1123) into the register as an attenuation coefficient (or a multiplication coefficient). On the other hand, the left (right) channel signal from the source 101 is converted by the A/D converter 1022 and then temporarily stored in the register 1023 in a digital data form. The multiplier 1024 performs a multiplication operation on data stored in the registers 1021 and 1023 and outputs the multiplication resultant data onto a bus 1025. Therefore, the signal amplitude attenuation operation is performed by storing the coefficient data smaller than one into the register 1021 from the memory 1115 (1125).

Figure 7:
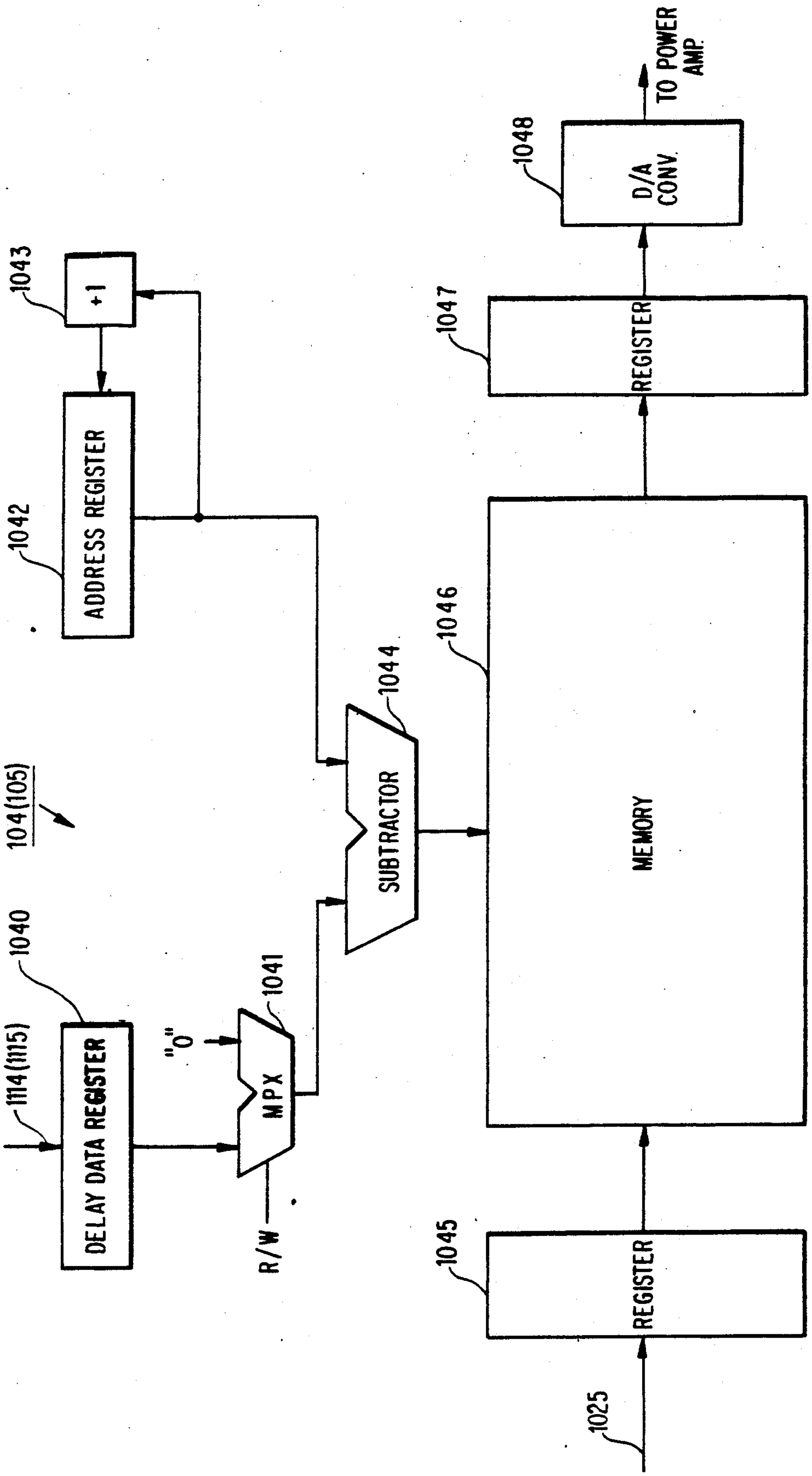
FIG. 7 is a block diagram representative of each delay circuit shown in FIG. 1.

The delay data from the memories 1115 and 1125 are supplied to the delay circuits 104 and 105, respectively. Each of the delay circuits 104 and 105 has the same circuit construction and includes, as shown in FIG. 7, a delay data register 1040, a multiplexer (MPX) 1041, a write-address register 1042, an incrementer 1043, a subtractor 1044, audio data registers 1045 and 1047, a memory 1046 and a D/A converter 1048. In a digital audio data processing, the process for the audio data is executed repeatedly in a data sampling cycle. In order to perform a signal phase delay operation, the present delay circuit writes the audio data, which is currently transferred thereto in the data sampling cycle, into the memory 1046 and reads the audio data, which has been already written into the memory 1046 before the currently transferred audio data, from the memory 1046. The data for calculating the address location storing the data to be read-out is thus stored into the delay data register 1040. More specifically, the delay data from the memory 1115 (1125) is supplied and stored into the register 1040 as offset address data corresponding to a delay value, by which a read-address to the memory 1046 is calculated. The address register 1042 stores the write-address designating the memory location of the memory 1046 into which the current audio data from the register 1045 is to be written. The multiplexer 1041 is controlled by a read/write signal R/W. When this signal R/W takes "0" to designate a data write operation, the multiplexer 1041 selects the data "0". On the other hand, by the signal R/W of "1"designating a data read operation, the multiplexer 1041 selects the data from the register 1040. The subtractor 1044 performs a subtraction operation of the output of the multiplexer 1041 from the data of the register 1042 and supplies the resultant data to the memory 1046. Therefore, the audio data from the attenuator 102 (103) is written into the location of the memory 1046 designated by the address from the register 1042, whereas the data stored in the location of the memory 1046 designated by the address obtained by subtracting the content of the register 1040 from the content of the register 1042 is read out therefrom and stored into the register 1047. As a result, a predetermined delay time is obtained from the data sampling cycle and the content to be stored in the register 1040. The output from the register 1047 is converted into an analog signal by the converter 1048 and then supplied to the power amplifier 107 (108).

Turning now to FIG. 2, since the speakers 109 and 110 are disposed at the distances $R_1$ and $R_2$ ($R_1>R_2$) from the listener 201, respectively, the sound pressure reaching the listener 201 from the speaker 110 is stronger than that from the speaker 109. Accordingly, the listener 201 rotates the balance control knob 1060 in the left direction or pushes the left channel key 1065, so that the address from the generator 1062 or 1068 is changed in the manner of "00H"→"01H"→"02H"→ . . . . The data designating no level attenuation and no phase delay are thereby outputted from the left channel balance control memory 1115, whereas the data for increasing the level attenuation and phase delay are read out from the right channel balance control memory 1125. In the present embodiment, the attenuation data stored in each of the memories 1115 and 1125 are present such that the corresponding channel sound pressure is reduced by 1 [dB] in accordance with one address change to the memory. Accordingly, the sound pressure reaching the listener 201 from the right channel speaker 110 is attenuated 1 [dB] by 1 [dB] in accordance with the operation of the knob 1060 or kay 1065, and the phase of the right channel speaker output is also delayed accordingly. Assume that the sound pressures reaching the listener 201 from the speakers 109 and 110 becomes equal to each other by attenuating the sound pressure from the speaker 110 by 4 [dB]. In this case, from the above equation (6) with the value of $S=360$ [m/sec] and $R_1=2$ [m], the sound propagation time difference C becomes about 2.05 [msec]. Assuming that the data sampling cycle described with reference to FIG. 7 is 22.7 [μsec], in order to obtain a delay time of about 2.05 [msec], the data read operation is carried out on the address location of the memory 1046, which is smaller by 90 than the address location to be stored with the current audio address. Therefore, the memory location of the bank 1122 designated by the address "04H" stores 90 (="5AH"). Thus, the right channel speaker 110 is controlled to be located imaginarily at a distance $R_1$ from the listener 201, as shown by the dotted line 110' in FIG. 2. The balance control for both the sound pressure and phase is thereby realized.

Figure 8:
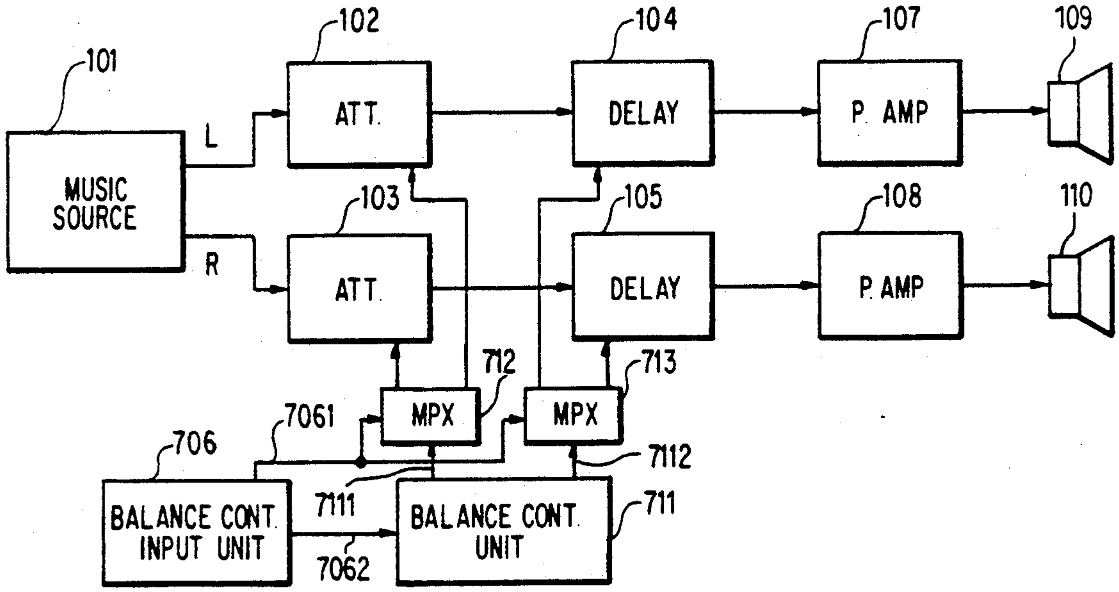
FIG. 8 is a block diagram representative of another embodiment of the present invention.

Referring to FIG. 8, there is shown another embodiment of the present invention, in which the same constituents as those shown in FIG. 1 are denoted by the same reference numerals to omit the further description thereof. In the present embodiment, only one balance control unit 711 is provided, which includes a memory (not shown) storing attenuation and delay data. The memory capacity of this memory is half of the memory 1115 or 1125 and stores only the data of the address locations "FFH" to "E0H" of the memory 1115 or "01H" to "1FH" of the memory 1125. An input unit 706 therefore generates a memory access address 7062 which is changed only in a decrement direction or in an increment direction. The input unit 706 further outputs flag information 7061 for designating a channel to be balance-controlled. This flag information 7061 is supplied to multiplexers 712 and 713 receiving the attenuation data 7111 and delay data 7112 from the unit 711, respectively. When the flag information 7061 assumes logic "1", the multiplexers 712 and 713 supplying the data 7111 and 7112 to the attenuator 102 and the delay circuit 104, respectively. On the other hand, in case of the flag information 7061 assuming logic "0", the multiplexers 712 and 713 supply the data 7111 and 7112 to the attenuator 103 and the delay circuit 105, respectively. The attenuator 102 or 103 and the delay circuit 103 or 105, which are not designated by the flag information 7061, are preset with data for indicating no attenuation and no delay. Thus, the present embodiment also performs the balance control such that the respective speakers are disposed imaginarily at the same distance from a listener.

It is apparent that the present invention is not limited to the above embodiments, but may be modified and changed without departing from the scope and spirit of the invention. For example, the combination composed of only one attenuator and only one delay circuit can perform the level attenuation and phase delay operation of both left and right channel signal in a time sharing manner. The respective attenuation and delay data can be obtained by the arithmetic operation by use of the equations (1) to (6). The phase delay operation may be performed prior to the level attenuation operation. Moreover, the present invention can be applied to a car audio system having four speakers, two of which are used as front left and right speakers and the remaining two of which are used as rear left and right speakers.

What is claimed is:

1. An audio signal processing system for controlling a balance between sounds produced by first and second speakers in response to balance control information and to a first audio signal for said first speaker and a second audio signal for said second speaker from an audio signal source, said audio signal processing system comprising: attenuation means inserted in a signal path between said audio signal source and each of said first and second speakers for performing an amplitude attenuation operation on a selected one of said first and second audio signals from said audio signal source in response to first data applied thereto, said attenuation means attenuating the amplitude of said selected, one of said first and second audio signals so that a pressure of the sound produced by said first speaker is different from a pressure of the sound produced by said second speaker, delay means inserted in said signal path in series with said attenuation means for performing a phase delay operation on the said selected one of said first and second audio signals from said audio signal source in response to second data applied thereto, said delay means delaying the phase of said selected one of said first and second audio signals so that a phase of the sound produced by said first speaker is different from a phase of the sound produced by said second speaker, means responsive to said balance control information for generating both said first and second data, means for applying said generated first data to said attenuation means, and means for applying said generated second data to said delay means, every value of said balance control data generating corresponding fixed values for said first and second data.

2. The system as claimed in claim 1, wherein said generating means includes a memory having a plurality of first memory locations each storing the first data and a plurality of second memory locations each storing the second data and memory access means responsive to said balance control information for accessing one of said first memory locations and one of said second locations.

3. The system as claimed in claim 2, wherein said attenuation means includes a multiplier for performing a multiplication operation on said selected one of said first and second audio signals and the first data.

4. The system as claimed in claim 2, wherein said delay means include storage means, data write means for writing said selected one of said first and second audio signals into said storage means, and data read means for reading the data from said storage means by use of the second data.

5. A audio signal processing system for performing a balance control between left and right channels in a stereophonic audio signal in response to balance control information, comprising: means responsive to a variable, single content of balance control information for generating both amplitude attenuation data and phase delay data, means responsive to said balance control information for performing an amplitude attenuation operation on a designated one of said left and right channels, and means responsive to said phase delay data for performing a phase delay operation on said designated channel, wherein not only left and right sound pressures responsive to the left and right channels reaching a listener, but also left and right sound phases responsive to the left and right channels reaching a listener at a given listening position are made substantially coincident with each other for a corresponding given value of said balance control information.

6. A system comprising means for generating a plurality of sound output signals, a plurality of speakers each reproducing a sound in response to a corresponding one of said output signals, means for generating balance information between said sound output signals, means responsive to said balance information for generating both amplitude control data and phase control data for a sound output signal to be controlled, and means responsive to said amplitude control data and phase control data for controlling an amplitude and a phase of said sound output signal to be controlled such that a pressure and a phase of the sound reproduced by the speaker corresponding to said sound output signal to be controlled reach a listener at a given listening position with substantially the same pressure and phase as the sound reproduced by the other speaker reaching said listener at said given listening position for a corresponding given value of said balance information.

* * * * *